(12) United States Patent
Franck et al.

(10) Patent No.: US 10,879,910 B1
(45) Date of Patent: Dec. 29, 2020

(54) METHOD AND APPARATUS FOR LOCKING A TRANSMITTER OSCILLATOR TO A REFERENCE CLOCK SIGNAL IN A FREQUENCY DOMAIN

(71) Applicant: Mellanox Technologies Denmark ApS., Roskilde (DK)

(72) Inventors: Thorkild Franck, Roskilde (DK); Ulrik Wismar, Kalundborg (DK); Ran Sela, Givat Shmuel (IL); Chen Gaist, Tel Aviv (IL); Afek Bernhard, Zur Hadasa (IL)

(73) Assignee: Mellanox Technologies Ltd., Yokneam (IL)

( * ) Notice: Subject to any disclaimer, the term of this patent is extended or adjusted under 35 U.S.C. 154(b) by 0 days.

(21) Appl. No.: 16/560,736

(22) Filed: Sep. 4, 2019

(51) Int. Cl.
*H03L 7/085* (2006.01)
*H03L 7/087* (2006.01)
*H03L 7/093* (2006.01)
*H03L 7/091* (2006.01)

(52) U.S. Cl.
CPC .............. *H03L 7/085* (2013.01); *H03L 7/087* (2013.01); *H03L 7/091* (2013.01); *H03L 7/093* (2013.01); *H03L 2207/50* (2013.01)

(58) Field of Classification Search
CPC ......... H03L 7/085; H03L 7/087; H03L 7/091; H03L 7/093; H03L 2207/50
USPC ................................ 327/147, 150, 156, 159
See application file for complete search history.

(56) References Cited

U.S. PATENT DOCUMENTS

2009/0289730 A1* 11/2009 Kawamura .......... H03D 13/003
331/1 A

* cited by examiner

*Primary Examiner* — William Hernandez
(74) *Attorney, Agent, or Firm* — Alston & Bird LLP (57) ABSTRACT

Methods and apparatuses are provided for locking a transmitter oscillator to a reference clock signal in a frequency domain. The apparatus includes a digital phase-frequency detector. The digital phase-frequency detector includes a mod-M counter, a mod-N counter, and a count evaluation digital circuit. The mod-M counter is designed to count reference clock cycles of a reference clock signal. The mod-N counter is designed to count local clock cycles of a local clock signal. The count evaluation digital circuit is designed to compare the counted reference clock cycles and the local clock cycles with a predefined register setting to generate a control signal as a feedback signal. The control signal is transmitted to the transmitter oscillator through a frequency-locked loop circuit for adjusting the frequency of the transmitter oscillator to be consistent with the reference clock signal.

18 Claims, 8 Drawing Sheets

METHOD AND APPARATUS FOR LOCKING A TRANSMITTER OSCILLATOR TO A REFERENCE CLOCK SIGNAL IN A FREQUENCY DOMAIN

BACKGROUND

In communication systems, accurate and synchronized clocks are important to coordinate activities between cooperating circuit units in a module to provide effective communication. Various methods and apparatuses exist that are designed to lock a transmitter oscillator in a transmitter module to a reference clock signal for synchronizing signals transmitted in the transmitter module and recovering distorted or noisy signals to improve communication. Applicant has identified many deficiencies and problems associated with existing methods and apparatuses. Through applied effort, ingenuity, and innovation, these identified deficiencies and problems have been solved by developing solutions that are in accordance with the embodiments of the present disclosure, many examples of which are described in detail herein.

BRIEF SUMMARY

In general, embodiments of the present disclosure provide methods, apparatuses, and/or the like for locking a transmitter oscillator to a reference clock signal in a frequency domain using a digital phase-frequency detector. The digital phase-frequency detector may lock the transmitter oscillator in the frequency domain by utilizing two counters to count reference clock cycles of the reference clock signal and local clock cycles of the local clock signal associated with the transmitter module that comprises the transmitter oscillator, and by utilizing a count evaluation digital circuit to generate a control signal as a feedback signal to adjust the frequency of the transmitter oscillator.

In embodiments, a digital phase-frequency detector comprises a count evaluation circuit, a mod-M counter associated with a modulus value M, and a mod-N counter associated with a modulus value N.

In embodiments, the mod-M counter is configured to receive a reference clock signal, count reference clock cycles of the reference clock signal based on the modulus value M, and generate a reference clock cycle count signal to be transmitted to the count evaluation digital circuit based on the reference clock cycles.

In embodiments, the mod-N counter is configured to receive a local clock signal associated with a transmitter oscillator, count local clock cycles of the local clock signal based on the modulus value N, and generate a local clock cycle count signal to be transmitted to the count evaluation digital circuit based on the local clock cycles.

In embodiments, the count evaluation digital circuit is configured to receive the reference clock cycle count signal from the mod-M counter and the local clock cycle count signal from the mod-N counter, receive a predefined register setting associated with a fixed ratio between the modulus value M and the modulus value N, and compare the reference clock cycle count signal and the local cycle count signal with the predefined register setting to generate a control signal.

In embodiments, the transmitter oscillator comprises a voltage-controlled oscillator (VCO), a number-controlled oscillator (NCO), or a digitally controlled oscillator (DCO).

In embodiments, the apparatus further comprises a multiplexer configured to generate a combined reference clock signal based on incoming reference clock signals received from digital channels associated with a same chip comprising the transmitter oscillator or different chips.

In embodiments, the digital phase-frequency detector further comprises a flip-flop digital circuit configured to sample the combined reference clock signal based on the local clock signal for generating the reference clock signal to be transmitted to the mod-M counter.

In embodiments, the apparatus further comprises a divider configured to provide the local clock signal to the digital channels associated with the same chip comprising the transmitter oscillator or the different chips.

In embodiments, the digital phase-frequency detector further comprises a control logic digital circuit configured to receive the reference clock cycle count signal from the mod-M counter, generate an enable/reset signal based on the reference clock cycle count signal, and transmit the enable/reset signal to the mod-N counter.

In embodiments, the generation of the local clock cycle count by the mod-N counter is further based on the enable/reset signal.

In embodiments, the apparatus further comprises a loop filter configured to receive the control signal generated by the count evaluation digital circuit of the digital phase-frequency detector and transmit the control signal to the transmitter oscillator for adjusting a frequency of the local clock signal to be consistent with the reference clock signal.

In embodiments, the control signal comprises at least an up signal and a down signal.

In embodiments, a method for locking a transmitter oscillator to a reference clock signal in a frequency domain comprises receiving, by a mod-M counter associated with a modulus value M, the reference clock signal.

In embodiments, the method further comprises counting, by the mod-M counter, reference clock cycles of the reference clock signal based on the modulus value M.

In embodiments, the method further comprises generating, by the mod-M counter, a reference clock cycle count signal to be transmitted to a count evaluation digital circuit based on the reference clock cycles.

In embodiments, the method further comprises receiving, by a mod-N counter associated with a modulus value N, a local clock signal associated with a transmitter oscillator.

In embodiments, the method further comprises counting, by the mod-N counter, local clock cycles of the local clock signal based on the modulus value N.

In embodiments, the method further comprises generating, by the mod-N counter, a local clock cycle count signal to be transmitted to the count evaluation digital circuit based on the local clock cycles.

In embodiments, the method further comprises receiving, by the count evaluation digital circuit, the reference clock cycle count signal from the mod-M counter and the local clock cycle count signal from the mod-N counter.

In embodiments, the method further comprises receiving, by the count evaluation digital circuit, a predefined register setting associated with a fixed ratio between the modulus value M and the modulus value N.

In embodiments, the method further comprises comparing, by the count evaluation digital circuit, the reference clock cycle count signal and the local cycle count signal with the predefined register setting to generate a control signal.

In embodiments, the transmitter oscillator comprises a voltage-controlled oscillator (VCO), a number-controlled oscillator (NCO), or a digitally controlled oscillator (DCO).

In embodiments, the method further comprises generating, by a multiplexer, a combined reference clock signal based on incoming reference clock signals received from digital channels associated with a same chip comprising the transmitter oscillator or different chips.

In embodiments, the method further comprises sampling, by a flip-flop digital circuit, the combined reference clock signal based on the local clock signal for generating the reference clock signal to be transmitted to the mod-M counter.

In embodiments, the method further comprises providing, by a divider, the local clock signal to the digital channels associated with the same chip comprising the transmitter oscillator or the different chips.

In embodiments, the method further comprises receiving, by a control logic digital circuit, the reference clock cycle count signal from the mod-M counter.

In embodiments, the method further comprises generating, by the control logic digital circuit, an enable/reset signal based on the reference clock cycle count signal.

In embodiments, the method further comprises transmitting, by the control logic digital circuit, the enable/reset signal to the mod-N counter.

In embodiments, the generation of the local clock cycle count by the mod-N counter is further based on the enable/reset signal.

In embodiments, the method further comprises receiving, by a loop filter, the control signal generated by the count evaluation digital circuit.

In embodiments, the method further comprises transmitting, by the loop filter, the control signal to the transmitter oscillator for adjusting a frequency of the local clock signal to be consistent with the reference clock signal.

In embodiments, the control signal comprises at least an up signal and a down signal.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Having thus described some embodiments in general terms, references will now be made to the accompanying drawings, which are not drawn to scale, and wherein:

DETAILED DESCRIPTION OF VARIOUS EMBODIMENTS

Various embodiments of the present disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein. Rather, these embodiments are provided so that this disclosure will satisfy applicable legal requirements. The term "or" is used herein in both the alternative and conjunctive sense, unless otherwise indicated. The terms "illustrative," "example," and "exemplary" are used to refer to examples with no indication of quality level. Like numbers refer to like elements throughout.

Overview

Various embodiments of the disclosure generally relate to a method for locking a transmitter oscillator to a reference clock signal in a frequency domain. More specifically, various embodiments of the present disclosure are related to introducing a digital phase-frequency detector for generating a control signal as a feedback signal. The digital phase-frequency detector receives a reference clock signal as a target for frequency locking the transmitter oscillator and a local clock signal transmitted by the transmitter oscillator to be tuned or adjusted. The digital phase-frequency detector further uses two counters to count clock cycles separately for the received reference clock signal and the received local clock signal. The digital phase-frequency detector then evaluates the counted clock cycle results to generate the control signal. The generated control signal may further be sent back to the transmitter oscillator through a digital frequency-locked loop for adjusting the frequency of the transmitter oscillator to be consistent with the frequency of the reference clock signal.

A transmitter module requires a reference clock signal to coordinate actions of multiple digital circuits included in the transmitter module, such that all of the multiple digital circuits may operate in synchronization. However, the different digital circuits require different frequency bands suitable for their own operation. For instance, the operating frequency of input/output (I/O) buffers are generally limited to be operated at a low frequency of 200 MHz, while a transmitter oscillator is required to be operated at a higher frequency of 25 GHz. This introduces new challenges to locking the local high frequency transmitter oscillator to a low frequency reference clock that is associated with other digital circuits due to the inconsistency of the high operating frequency and the low operating frequency.

To address the above described challenges, some existing systems and approaches may use analog phase frequency detectors. However, the design of the analog phase frequency detector requires complicated circuit design in the analog domain which has space constraints and is hard to verify using standard commercial tools or tests. Systems structured in accordance with various embodiments of the present disclosure overcome challenges faced by existing systems by using a phase-frequency detector in the digital domain, which requires less complex design compared to the design in the analog domain with space constraints. The digital phase-frequency detector provided is more easily verified by standard commercial tools or tests.

In the present disclosure, solutions are provided to resolve the issues of locking a transmitter oscillator operating at a high frequency to a low frequency reference clock signal. The apparatus structured in accordance with various embodiments of the present disclosure utilizes a fixed ratio between the high frequency local clock and the low frequency reference clock, rather than directly utilizing the low frequency reference clock, to lock the transmitter oscillator. The fixed ratio represents a targeted frequency ratio that is used to generate a control signal as a feedback signal for controlling the frequency of the transmitter oscillator. In some embodiments, the apparatus comprises a digital phase-frequency detector. The digital phase-frequency detector comprises a mod-M counter, a mod-N counter, and a count evaluation digital circuit. The mod-M counter is configured to count reference clock cycles of a reference clock signal. The mod-N counter is configured to count local clock cycles of a local clock signal.

The count evaluation digital circuit is configured to compare the counted reference clock cycles and the local clock cycles with predefined register settings (e.g., in embodiments a target count of reference clock cycles is utilized as well as a target count of local clock cycles), which represents the targeted frequency ratio of the local clock signal and the reference clock signal, to generate a control signal as a feedback signal. The control signal is transmitted to the transmitter oscillator through a frequency-locked loop circuit (e.g., comprising a digital loop filter) for adjusting the frequency of the transmitter oscillator to be consistent with the reference clock signal. Through the application of the apparatuses and methods disclosed in the present disclosure, the transmitter oscillator may be effectively locked to the frequency of the reference clock signal.

As such, systems structured in accordance with various embodiments of the disclosure provide specific, technical solutions to technical problems faced by existing systems, the details of which are described hereinafter.

Definitions

As used herein, the terms "circuit," "circuitry," "module," "module packaging," "semiconductor device," and similar terms may be used interchangeably and should be understood broadly to include hardware and, in some embodiments, electronic circuit packages or electronic circuit components for configuring the hardware. For example, in some embodiments, "circuit" may include electronic circuit components, such as capacitors, resistors, inductors, inverters, amplifiers, diodes, transistors, and the like. In some embodiments, a circuit is implemented by way of a hardware description language (i.e., Verilog, VHDL) that is synthesized into physical circuitry.

As used herein, the term "transmitter oscillator" refers to an electronic circuit in a transmitter module that produces one or more periodic, oscillating electronic analog signals, such as a sine wave signal or a square wave signal, as a transmittal signal by converting a direct current (DC) signal received from a power supply to an alternating current (AC) signal. In some embodiments, the transmitter oscillator may be a voltage-controlled oscillator (VCO), a digitally controlled oscillator (DCO), or a number-controlled oscillator (NCO). As used herein, the term "voltage-controlled oscillator (VCO)" refers to an electronic circuit where the oscillation frequency of the output analog signal of the oscillator circuit is controlled by a voltage input. As used herein, the term "digitally controlled oscillator (DCO)" refers to an electronic circuit where the oscillation frequency of the output analog signal of the oscillator circuit is controlled by a digital control input.

As used herein, the term "frequency domain" refers to the analysis of mathematical functions of signals or waves with respect to the frequency scale, as opposed to the time scale.

As used herein, the term "digital phase-frequency detector" refers to a digital circuit designed to be implemented in transmitter modules to generate a control signal for locking the transmitter oscillator to a reference clock signal in frequency domain. In some embodiments, the digital phase-frequency detector comprises a mod-M counter (defined below), a mod-N counter (defined below), and a count evaluation digital circuit (defined below). In other embodiments, the digital phase-frequency detector may further comprise a flip-flop digital circuit (defined below) or a control logic digital circuit (defined below).

As used herein, the term "mod-M counter" refers to a digital circuit that takes a reference clock signal as input, counts clock cycles of the reference clock signal, and generates the number of clock cycles counted as its output. The mod-M counter is usually constructed by M number of flip-flop digital circuits connected in cascade to store M output states for counting. The term "modulus value M" refers to the M number of states the mod-M counter may use to count the input clock signal before returning to its original state.

As used herein, the term "reference clock signal" refers to an electronic signal that oscillates between a high state and a low state periodically. The reference clock signal may be generated by a clock generator and used to coordinate actions of digital circuits, such as a transmitter oscillator, other digital circuits in the transmitter module, etc. As used herein, the term "combined reference clock signal" refers to a reference clock signal that is generated based on selecting, by a multiplexer (defined below), among the reference clock signal defined above and other incoming reference clock signals received from other digital channels associated with a same chip or different chips within the transmitter module.

As used herein, the term "reference clock cycle" refers to a full periodic cycle of a reference clock signal. For instance, in circumstances where the reference clock signal is a square wave signal, the full periodic cycle starts from a rising edge of a high state to the next rising edge of a low state.

As used herein, the term "reference clock cycle count signal" refers to a digital output of the mod-M counter that comprises information regarding the number of clock cycles of the reference clock signal counted by the mod-M counter.

As used herein, the term "mod-N counter" refers to a digital circuit that takes a local clock signal as input, counts clock cycles of the local clock signal, and generates the number of clock cycles counted as its output. The mod-N counter is usually constructed by N number of flip-flop digital circuits connected in cascade to store N output states for counting. In embodiments, the term "modulus value N" refers to the N number of states the mod-N counter may use to count the input clock signal before returning to its original state. In embodiments, a mod-N counter may count a number of cycles until its count (i.e., resulting number of cycles), upon evaluation, reaches a target number of cycles. In embodiments, a count of the mod-N counter is collected and evaluated when a mod-M counter reaches its target count.

As used here, the term "local clock signal" refers to an electronic signal that oscillates between a high state and a low state periodically that is associated with a transmitter oscillator to coordinate actions of digital circuits within the transmitter oscillator. In embodiments, a local clock signal is an electronic signal output from a high-speed oscillator (e.g., 25.78125 GHz) that is divided down to a speed low enough of a synthesized digital clock. In examples, a CMOS node clock in the high MHz-range may be divided by 16 to reach a local clock signal of 1611 MHz.

As used herein, the term "local clock cycle" refers to a full periodic cycle of a local clock signal. For instance, in circumstances where the local clock signal is a square wave signal, the full periodic cycle starts from a rising edge of a high state to the next rising edge of a low state.

As used herein, the term "local clock cycle count signal" refers to a digital output of the mod-N counter that comprises information regarding the number of clock cycles of the local clock signal counted by the mod-N counter.

As used herein, the term "count evaluation digital circuit" refers to a digital circuit that is configured to receive clock cycle count results from the mod-M counter and the mod-N counter. The count evaluation digital circuit may further utilize a predefined register setting (defined below) associated with the modulus value M and the modulus value N to evaluate the received clock cycle count results for determining a control signal to adjust a frequency of the transmitter oscillator.

As used herein, the term "fixed ratio" refers to a ratio value of the modulus value M and the modulus value N, where the modulus value M is associated with the mod-M counter and the modulus value N is associated with the mod-N counter.

As used herein, the term "predefined register setting" refers to an electronically generated signal representing the fixed ratio defined above and is configured as an input signal of the count evaluation digital circuit.

As used herein, the term "control signal" refers to a digital signal that is generated by the digital phase-frequency detector for controlling or adjusting the frequency of the transmitter oscillator via a frequency-locked loop circuit. In some embodiments, the control signal may further comprise multiple signals, such as an up signal and a down signal. As used herein, the term "up signal" refers to a control signal that is used to increase a frequency of the transmitter oscillator. As used herein, the term "down signal" refers to a control signal that is used to decrease a frequency of the transmitter oscillator.

As used herein, the term "multiplexer" refers to a digital circuit that is configured to receive multiple input signals and select one of the input signals to be sent as one output signal.

As used herein, the term "flip-flop digital circuit" refers to a digital circuit having two stable states and is configured as a digital unit to store state information.

As used herein, the term "divider" refers to a digital circuit that is configured to receive a local clock signal and generate a new local clock signal with a frequency different from the received local clock signal. The new local clock signal is generated for providing the local clock signal information to other digital channels associated with the same chip of the transmitter oscillator or different chips within the transmitter module.

As used herein, the term "control logic digital circuit" refers to a digital circuit that is configured to receive the reference clock cycle count signal defined above for generating an enable/reset signal. The enable/reset signal may further be used to control the mod-N counter defined above.

Exemplary Digital Logic Circuits for Implementing Embodiments of the Present Disclosure Methods and apparatuses of the present disclosure may be embodied by any of a variety of transmitter modules comprising a transmitter oscillator and a digital phase-frequency detector.

Figure 1A:
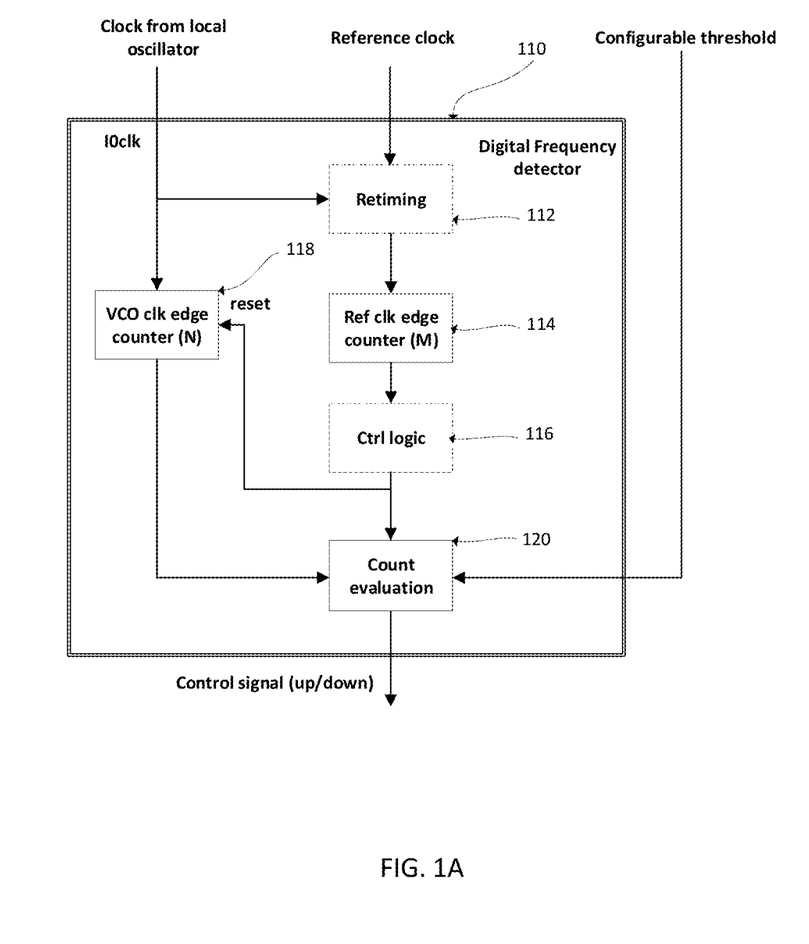
FIG. 1A is a block diagram illustrating exemplary digital logic circuits and digital signal flows associated with an exemplary digital phase-frequency detector, in accordance with some embodiments of the present disclosure.

FIG. 1A is a block diagram illustrating exemplary digital logic circuits and digital signal flows associated with an exemplary digital phase-frequency detector 110, in accordance with some embodiments of the present disclosure.

Figure 1B:
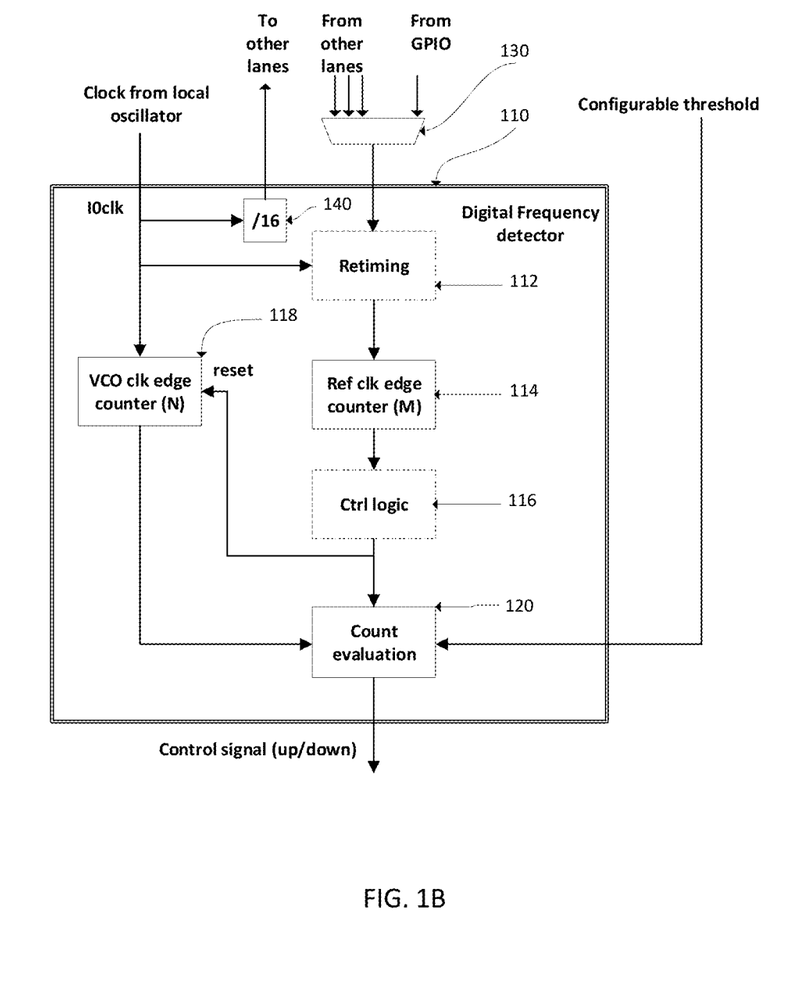
FIG. 1B is a block diagram illustrating exemplary digital logic circuits and digital signal flows associated with an exemplary digital phase-frequency detector, in accordance with some embodiments of the present disclosure.

In some embodiments, the digital phase-frequency detector 110 comprises a mod-M counter 114, a mod-N counter 118, and a count evaluation digital circuit 120. The mod-M counter 114 is configured to count clock cycles of a reference clock signal and generate a reference clock cycle count signal as its output. The mod-N counter 118 is configured to count clock cycles of a local clock signal (denoted by i0clk) associated with a transmitter oscillator and generate a local clock cycle count signal as its output. The count evaluation digital circuit 120 is configured to receive output signals of the mod-M counter 114 and mod-N counter 118, as well as a predefined register setting as its input. The predefined register setting is a fixed ratio of modulus value M and modulus value N representing a targeted clock cycle count ratio of the reference clock signal and the local clock signal. The count evaluation digital circuit 120 is further configured to compare the received reference clock cycle count signal and local clock cycle count signal with the predefined register setting for generating a control signal. As depicted in FIGS. 1A and 1B, the control signal may comprise an up signal (denoted by up) for increasing the frequency of the transmitter oscillator and a down signal (denoted by dw) for decreasing the frequency of the transmitter oscillator.

In another embodiment depicted in FIG. 1B, the digital phase-frequency detector 110 may further comprise a flip-flop digital circuit 112 and may further be associated with a multiplexer 130. In such embodiments, the multiplexer 130 is configured to receive a local clock signal (denoted by VcoRef) and other incoming reference clock signals from other digital channels that may be associated with the same chip comprising the transmitter oscillator or other different chips located within the transmitter module. In the example shown in FIG. 1B, the multiplexer 130 is a 5:1 multiplexer, which receives the local clock signal and four other incoming reference signals from other digital channels. The multiplexer 130 is further configured to select one of the signals received as an output signal to be transmitted to the flip-flop digital circuit 112. The flip-flop digital circuit 112 is configured to sample the selected signal received from the multiplexer 130 based on the reference clock signal to generate a combined reference clock signal to be counted by the mod-M counter 114.

It will be appreciated that, in certain embodiments, inclusion of flip-flop digital circuit 112 results in the digital phase-frequency detector 110 being a digital frequency detector (i.e., the digital frequency detector may not be able to detect phase differences in certain embodiments).

In other embodiments, the digital phase-frequency detector 110 may further comprise a control logic digital circuit 116. The control logic digital circuit 116 is configured to receive the reference clock cycle count signal comprising the clock cycle count result generated by the mod-M counter 114 to generate an enable/reset signal. The generated enable/reset signal may be used to control the mod-N counter 118.

In other embodiments, as shown in FIG. 1B, the digital phase-frequency detector 110 may further be associated with a divider 140. The divider 140 may be configured to receive the reference clock signal and generate a new reference clock signal comprising the information of the reference clock signal to be transmitted to other digital channels associated with a same chip comprising the transmitter oscillator or different chips located within the transmitter module.

Figure 2:
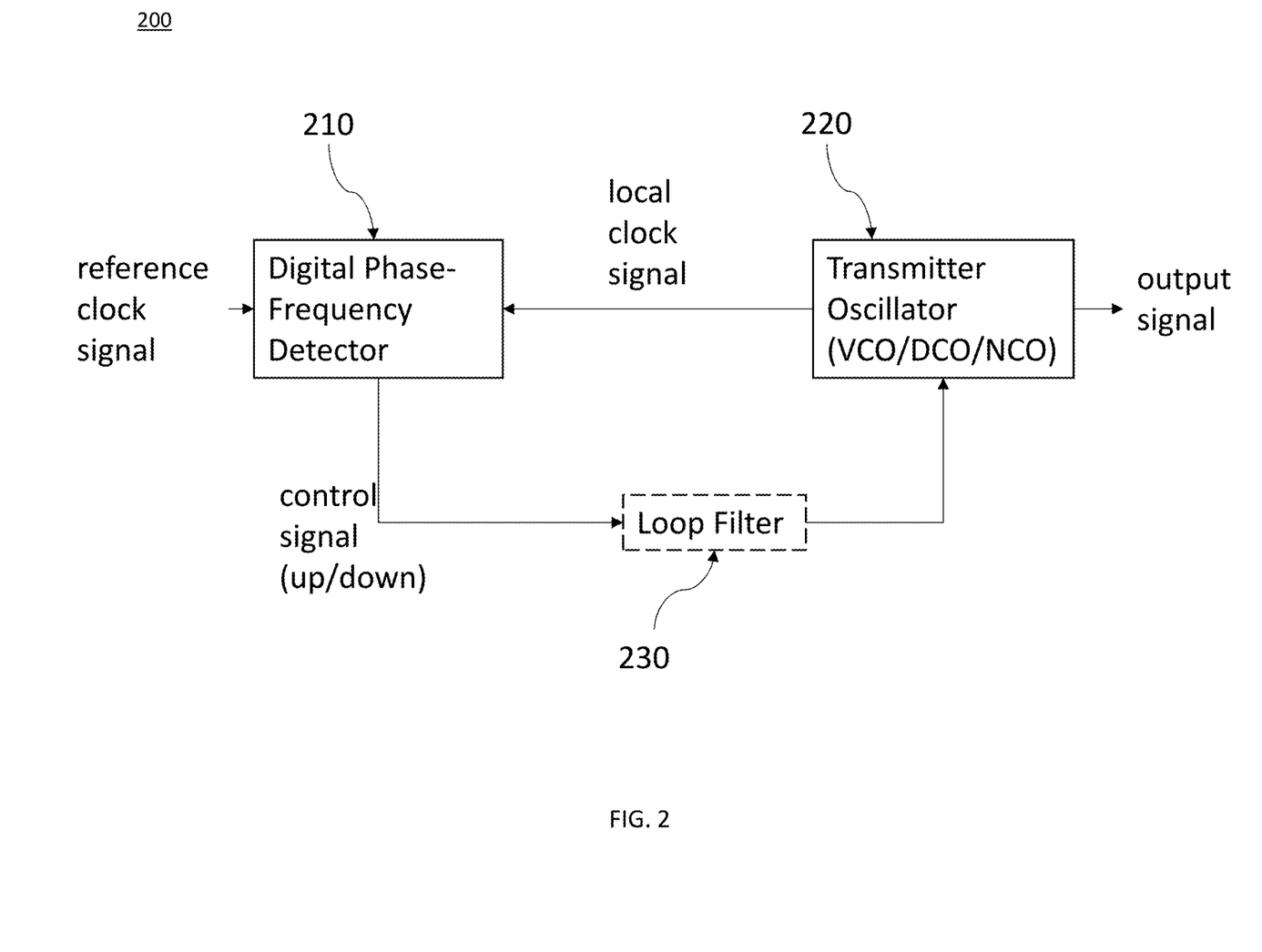
FIG. 2 is a block diagram illustrating an exemplary digital frequency-locked loop for adjusting a frequency of the transmitter oscillator using an exemplary digital phase-frequency detector and a control signal, in accordance with some embodiments of the present disclosure.

FIG. 2 is a block diagram illustrating an exemplary digital frequency-locked loop for adjusting a frequency of the transmitter oscillator 220 using an exemplary digital phase-frequency detector 210 and a control signal, in accordance with some embodiments of the present disclosure.

The digital frequency-locked loop 200 comprises a phase-digital frequency detector 210 as described in FIG. 1 and a transmitter oscillator 220. The transmitter oscillator 220 may be a VCO, NCO, or a DCO that provides a local clock signal to the digital phase-frequency detector 210. The digital phase-frequency detector 210, as described in FIG. 1, uses two counters to count clock cycles of the received reference clock signal and the local clock signal to generate a control signal as a feedback signal. The control signal may further be transmitted to the transmitter oscillator 220 directly or through a loop filter 230 for adjusting the frequency of the transmitter oscillator 220 such that the transmitter oscillator 220 may be operated at the frequency consistent with the reference clock signal.

Figure 3:
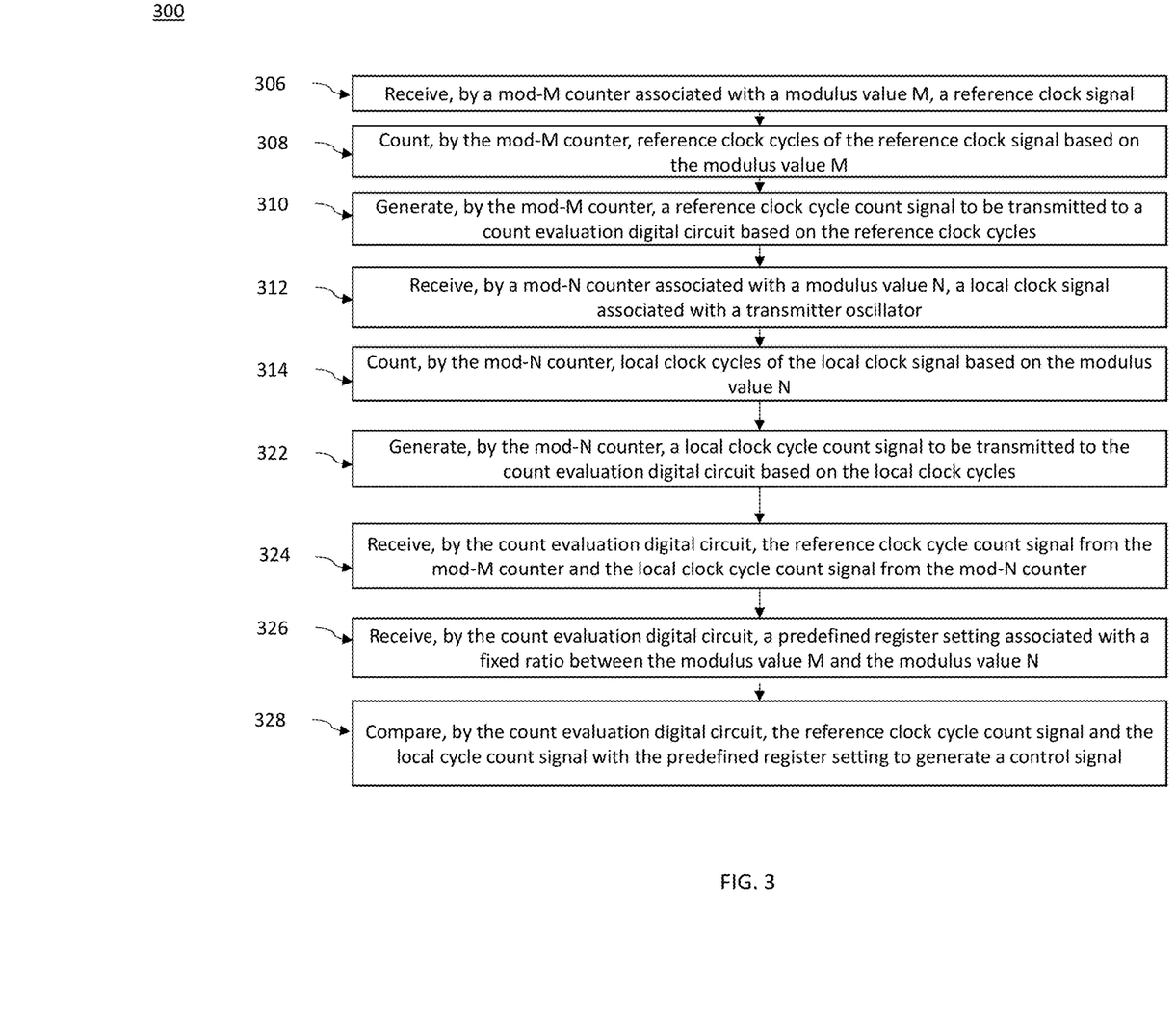
FIG. 3 illustrates a flow chart of a method for generating a control signal using an exemplary digital phase-frequency detector to lock a transmitter oscillator to a reference clock signal in a frequency domain, in accordance with some embodiments of the present disclosure.

Exemplary Processes for Locking a Transmitter Oscillator to a Reference Clock Signal in a Frequency Domain FIG. 3 illustrates a flow chart of a method 300 for generating a control signal using an exemplary digital phase-frequency detector to lock a transmitter oscillator to a reference clock signal in a frequency domain, in accordance with some embodiments of the present disclosure.

The exemplary apparatus used to perform the method 300 comprises a digital phase-frequency detector 110 as illustrated in FIGS. 1A and 1B. The digital phase-frequency detector 110 comprises a mod-M counter 114, a mod-N counter 118, and a count evaluation digital circuit 120.

At operation 306, the mod-M counter associated with a modulus value M receives a reference clock signal.

At operation 308, the mod-M counter counts reference clock cycles of the reference clock signal based on the modulus value M.

At operation 310, the mod-M counter generates a reference clock cycle count signal to be transmitted to a count evaluation digital circuit based on the reference clock cycles counted at operation 308.

At operation 312, a mod-N counter associated with a modulus value N receives a local clock signal that is associated with the transmitter oscillator.

At operation 314, the mod-N counter counts local clock cycles of the local clock signal based on the modulus value N.

At operation 322, the mod-N counter generates a local clock cycle count signal to be transmitted to the count evaluation digital circuit based on the local clock cycles counted at operation 314.

At operation 324, the count evaluation digital circuit receives the reference clock cycle count signal from the mod-M counter and the local clock cycle count signal from the mod-N counter.

At operation 326, the count evaluation digital circuit further receives a predefined register setting associated with a fixed ratio between the modulus value M and the modulus value N.

At operation 328, the count evaluation digital circuit compares the reference clock cycle count signal and the local cycle count signal with the predefined register setting to generate a control signal.

Figure 4:
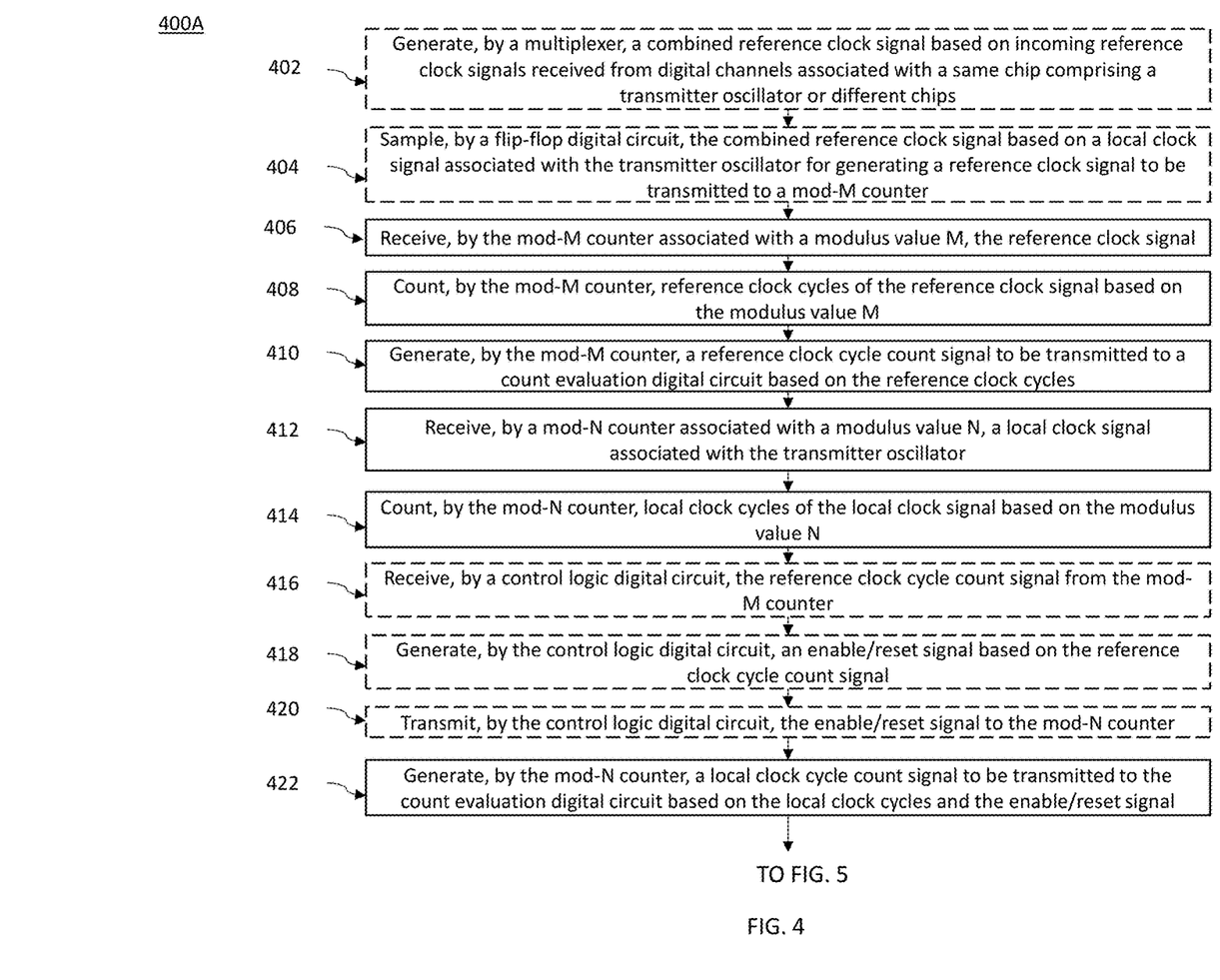
FIG. 4 illustrates a flow chart of a method for generating a reference clock cycle count signal and a local clock cycle count signal to be transmitted to a count evaluation digital circuit included in an exemplary digital phase-frequency detector, in accordance with some embodiments of the present disclosure.
Figure 5:
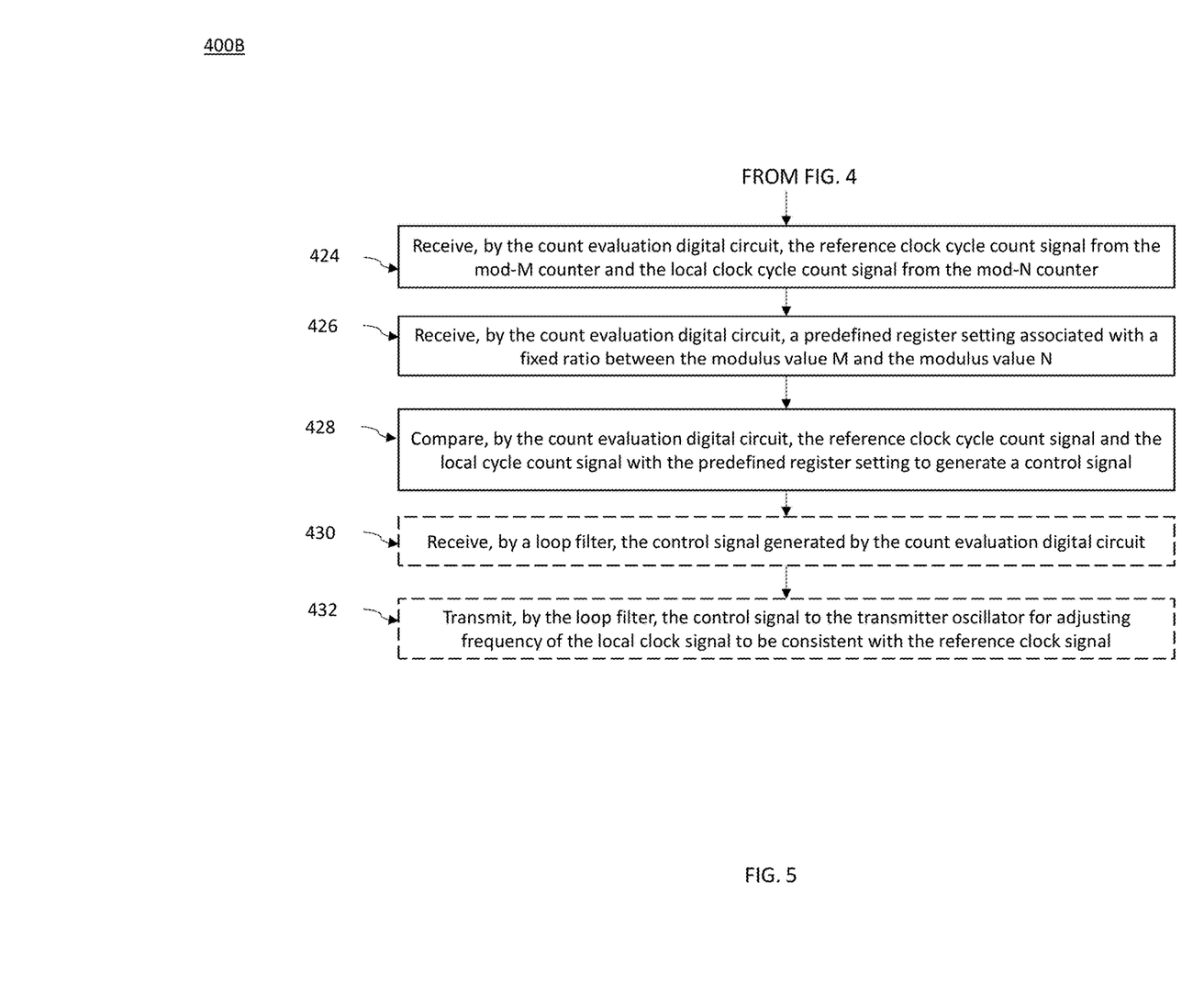
FIG. 5 illustrates a flow chart of a method for adjusting a frequency of the transmitter oscillator using an exemplary digital phase-frequency detector and a control signal generated by a count evaluation digital circuit, in accordance with some embodiments of the present disclosure.

FIG. 4 illustrates a flow chart of a method 400A for generating a reference clock cycle count signal and a local clock cycle count signal to be transmitted to a count evaluation digital circuit included in an exemplary digital phase-frequency detector, in accordance with some embodiments of the present disclosure. It will be appreciated that operations depicted in dashed lines/boxes in FIGS. 4 and 5 are optionally performed, in various embodiments.

The exemplary apparatus used to perform method 400A comprises a digital phase-frequency detector 110, a multiplexer 130, and a divider 140 as illustrated in FIGS. 1A and 1B. The digital phase-frequency detector 110 may comprise a mod-M counter 114, a mod-N counter 118, a count evaluation digital circuit 120, a flip-flop digital circuit 112, and a control logic digital circuit 116.

At operation 402, a multiplexer generates a combined reference clock signal based on incoming reference clock signals received from digital channels associated with a same chip comprising the transmitter oscillator or different chips.

At operation 404, a flip-flop digital circuit samples the combined reference clock signal based on the local clock signal for generating the reference clock signal to be transmitted to the mod-M counter.

At operation 406, a mod-M counter associated with a modulus value M receives the reference clock signal generated at operation 404.

At operation 408, the mod-M counter counts reference clock cycles of the reference clock signal based on the modulus value M.

At operation 410, the mod-M counter generates a reference clock cycle count signal to be transmitted to a count evaluation digital circuit based on the reference clock cycles counted at operation 408.

At operation 412, a mod-N counter associated with a modulus value N receives a local clock signal that is associated with the transmitter oscillator.

At operation 414, the mod-N counter counts local clock cycles of the local clock signal based on the modulus value N.

At operation 416, a control logic digital circuit receives the reference clock cycle count signal from the mod-M counter.

At operation 418, the control logic digital circuit generates an enable/reset signal based on the reference clock cycle count signal.

At operation 420, the control logic digital circuit transmits the enable/reset signal to the mod-N counter.

At operation 422, the mod-N counter generates a local clock cycle count signal to be transmitted to the count evaluation digital circuit based on the local clock cycles counted at operation 414 and the enable/reset signal generated at operation 418.

Following FIG. 4, FIG. 5 continues with a flow chart of a method 400 B for adjusting a frequency of the transmitter oscillator using an exemplary digital phase-frequency detector and a control signal, in accordance with some embodiments of the present disclosure. The control signal is generated by a count evaluation digital circuit based on the reference clock cycle count signal and the local clock cycle count signal generated in FIG. 4.

Following the method 400A illustrated in FIG. 4, at operation 424, the count evaluation digital circuit receives the reference clock cycle count signal from the mod-M counter and the local clock cycle count signal from the mod-N counter.

At operation 426, the count evaluation digital circuit receives a predefined register setting associated with a fixed ratio between the modulus value M and the modulus value N.

At operation 428, the count evaluation digital circuit compares the reference clock cycle count signal and the local cycle count signal with the predefined register setting to generate a control signal.

At operation 430, a loop filter receives the control signal generated by the count evaluation digital circuit.

At operation 432, the loop filter transmits the control signal to the transmitter oscillator for adjusting frequency of the local clock signal to be consistent with the reference clock signal.

Figure 6:
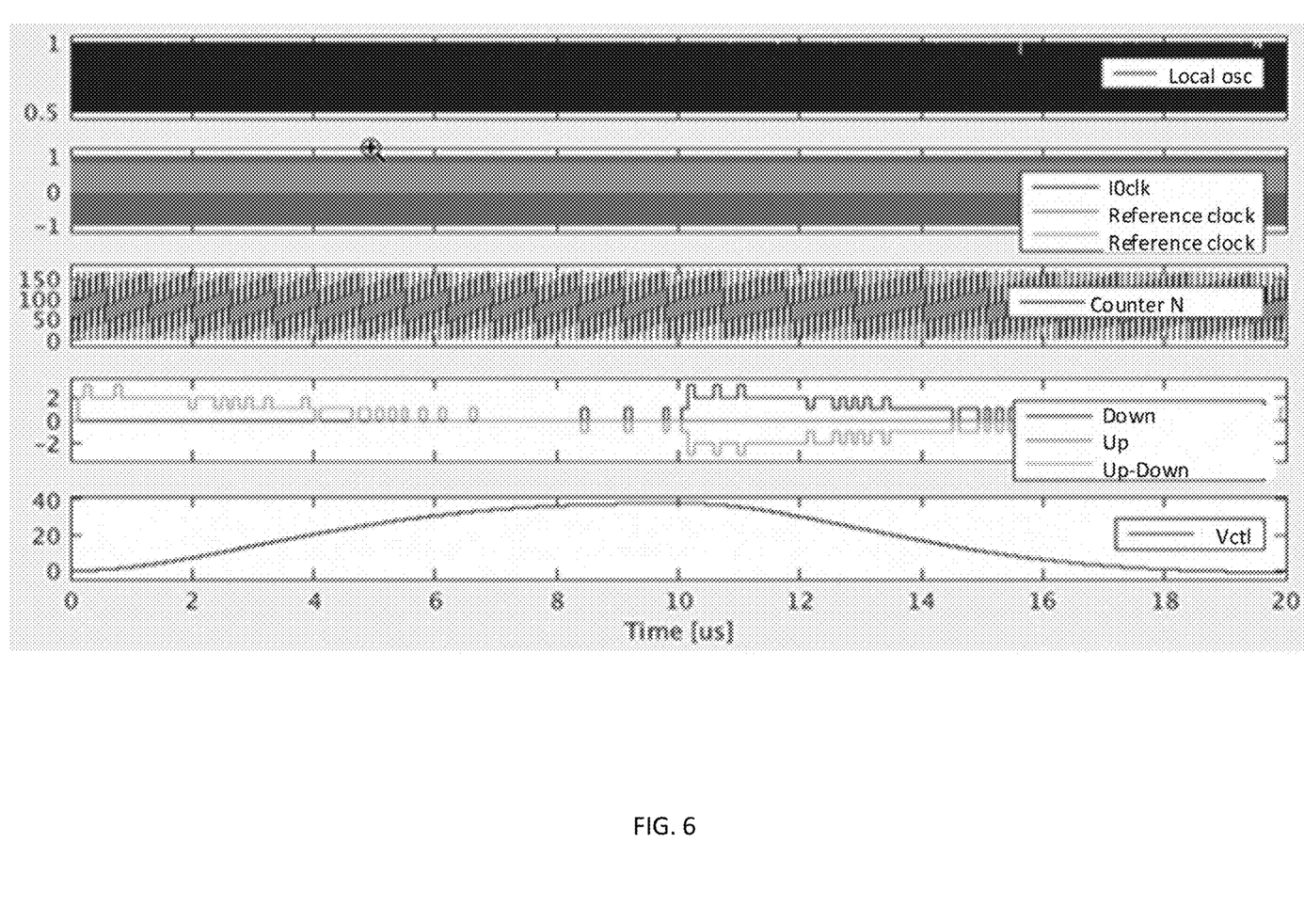
FIG. 6 is a simulation result illustrating the control signal of an exemplary digital phase-frequency detector output used to adjust a frequency of the transmitter oscillator, in accordance with some embodiments of the present disclosure.

FIG. 6 is a simulation result illustrating the control signal of an exemplary digital phase-frequency detector output used to adjust a frequency of the transmitter oscillator, in accordance with some embodiments of the present disclosure. FIG. 6 illustrates how the output signal of the digital phase-frequency detector is used to lock the frequency of the transmitter oscillator to the frequency of the reference clock signal.

Shown in FIG. 6, at time 0, the local oscillator frequency starts with an offset to the target frequency ratio. The digital phase-frequency detector provides a strong up signal, gradually changing the control voltage, Vctl, to the oscillator (e.g., Vctl is the control signal after the exemplary loop filter depicted in FIG. 2). At time 10 µs, the reference frequency has changed and the digital phase-frequency detector provides a strong down-signal. It will be appreciated that the scale of FIG. 6 does not provide for visual observation of actual frequency changes on the oscillator due to their miniscule size.

Shown in FIG. 6, the target ratio is 165 cycles on i0clk for each 8 cycles on the reference clock. Because of this, it can be seen that the Counter N nearly reaches 165 in each set of 8 reference clock cycles. After 8 reference cycles, the Counter N is reset. Also shown in FIG. 6, the up/down signal(s) illustrate the difference between the Counter N and 165 (e.g., 0, 1, 2, and in a few cases, 3). In embodiments, the up/down signal(s) can be a full scale up/down signal (i.e., 0, 1, 2, 3 as in FIG. 6), or may be a sign (e.g., +1, −1).

Figure 7:
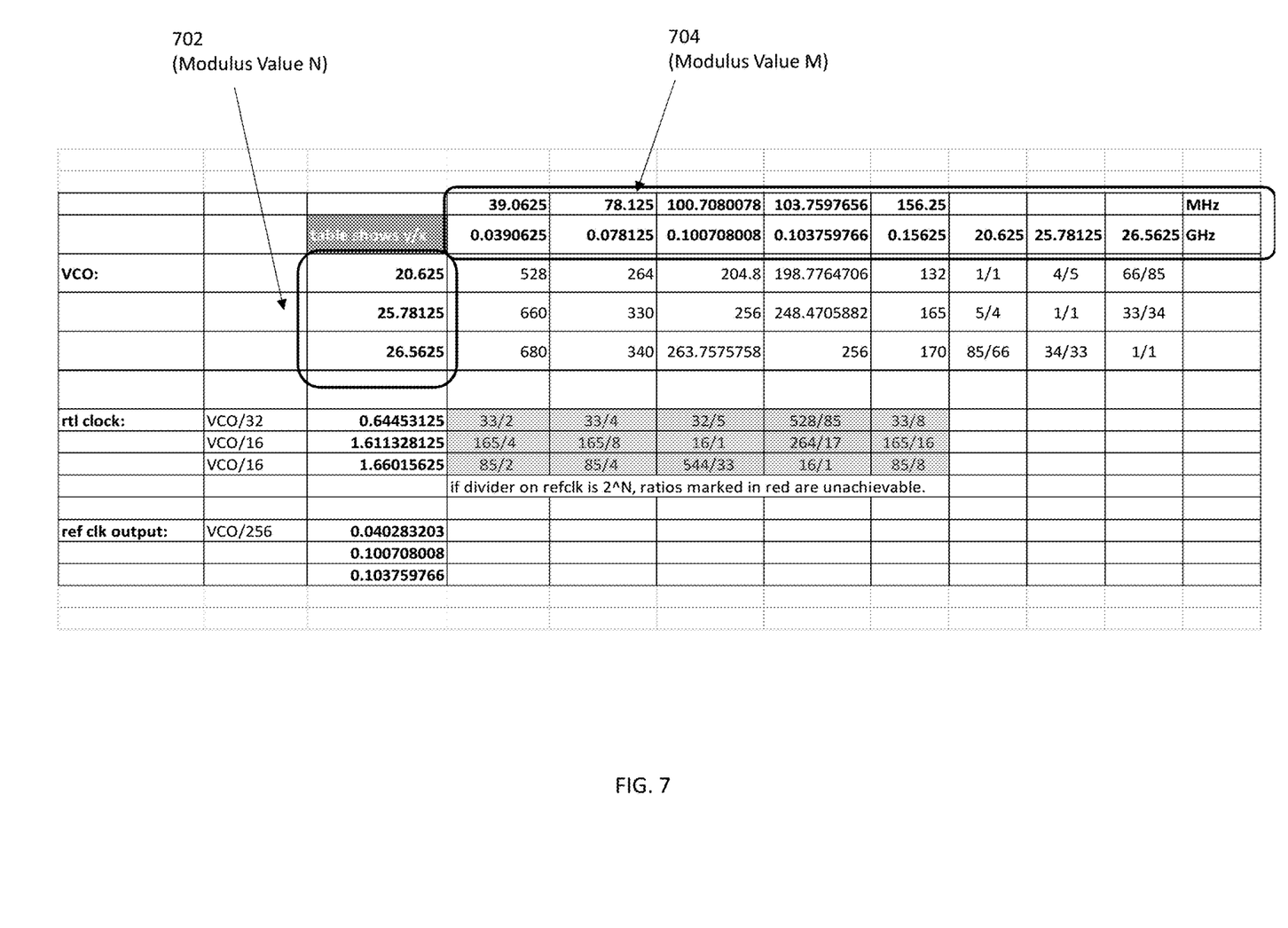
FIG. 7 is a table of exemplary fixed ratios between the modulus value M and the modulus value N, in accordance with some embodiments of the present disclosure.

FIG. 7 is a table of exemplary fixed ratios between the modulus value M and the modulus value N, in accordance with some embodiments of the present disclosure.

FIG. 7 shows examples of different fixed ratios between the modulus value M associated with the mod-M counter and the modulus value N associated with the mod-N counter. The modulus value N is shown in a column denoted by 702, and the modulus value M is shown in rows denoted by 704. The exemplary fixed ratio can be calculated by values in the corresponding location of the rows and column. For instance, the modulus M value 25.78125 GHz and the modulus N value 78.125 MHz is calculated to form the fixed ratio 25.78125 GHz/78.125 MHz=330, which can be set to be the predefined register setting as a frequency locking target. In the example depicted in FIG. 6, the predefined register holds a target count value (e.g., 165 for a target of 165 cycles on i0clk while the mod-N counter targets 8 cycles on the reference clock).

CONCLUSION

Many modifications and other embodiments of the disclosures set forth herein will come to mind to one skilled in the art to which these disclosures pertain having the benefit of the teachings presented in the foregoing description and the associated drawings. Therefore, it is to be understood that the disclosures are not to be limited to the specific embodiments disclosed and that modifications and other embodiments are intended to be included within the scope of the appended claims. Although specific terms are employed herein, they are used in a generic and descriptive sense only and not for purposes of limitation, unless described otherwise.

That which is claimed:

1. An apparatus, the apparatus comprising a digital phase-frequency detector, the digital phase-frequency detector comprising:
 a count evaluation digital circuit;
 a mod-M counter associated with a modulus value M, the mod-M counter configured to:
  receive a reference clock signal;
  count reference clock cycles of the reference clock signal based on the modulus value M; and
  generate a reference clock cycle count signal to be transmitted to the count evaluation digital circuit based on the reference clock cycles; and
 a mod-N counter associated with a modulus value N, the mod-N counter configured to:
  receive a local clock signal associated with a transmitter oscillator;
  count local clock cycles of the local clock signal based on the modulus value N; and
  generate a local clock cycle count signal to be transmitted to the count evaluation digital circuit based on the local clock cycles,
 wherein the count evaluation digital circuit is configured to:
  receive the reference clock cycle count signal from the mod-M counter and the local clock cycle count signal from the mod-N counter;
  receive a predefined register setting associated with a fixed ratio between the modulus value M and the modulus value N; and
  compare the reference clock cycle count signal and the local cycle count signal with the predefined register setting to generate a control signal.

2. The apparatus of claim 1, wherein the transmitter oscillator comprises a voltage-controlled oscillator (VCO), a number-controlled oscillator (NCO), or a digitally controlled oscillator (DCO).

3. The apparatus of claim 1, further comprising a multiplexer configured to:
 generate a combined reference clock signal based on incoming reference clock signals received from digital channels associated with a first chip comprising the transmitter oscillator or other chips within a transmitter module comprising the first chip and the other chips.

4. The apparatus of claim 3, wherein the digital phase-frequency detector further comprises a flip-flop digital circuit configured to:
sample the combined reference clock signal based on the local clock signal for generating the reference clock signal to be transmitted to the mod-M counter.

5. The apparatus of claim 3, further comprising a divider configured to provide the local clock signal to the digital channels associated with the first chip comprising the transmitter oscillator or the other chips.

6. The apparatus of claim 1, wherein the digital phase-frequency detector further comprises a control logic digital circuit configured to:
receive the reference clock cycle count signal from the mod-M counter;
generate an enable/reset signal based on the reference clock cycle count signal; and
transmit the enable/reset signal to the mod-N counter.

7. The apparatus of claim 6, wherein the generation of the local clock cycle count signal by the mod-N counter is further based on the enable/reset signal.

8. The apparatus of claim 1, further comprising a loop filter configured to:
receive the control signal generated by the count evaluation digital circuit of the digital frequency detector; and
transmit the control signal to the transmitter oscillator for adjusting frequency of the local clock signal to be consistent with the reference clock signal.

9. The apparatus of claim 1, wherein the control signal comprises at least an up signal and a down signal.

10. A method, comprising:
receiving, by a mod-M counter associated with a modulus value M, a reference clock signal;
counting, by the mod-M counter, reference clock cycles of the reference clock signal based on the modulus value M;
generating, by the mod-M counter, a reference clock cycle count signal to be transmitted to a count evaluation digital circuit based on the reference clock cycles;
receiving, by a mod-N counter associated with a modulus value N, a local clock signal associated with a transmitter oscillator;
counting, by the mod-N counter, local clock cycles of the local clock signal based on the modulus value N;
generating, by the mod-N counter, a local clock cycle count signal to be transmitted to the count evaluation digital circuit based on the local clock cycles;
receiving, by the count evaluation digital circuit, the reference clock cycle count signal from the mod-M counter and the local clock cycle count signal from the mod-N counter;
receiving, by the count evaluation digital circuit, a predefined register setting associated with a fixed ratio between the modulus value M and the modulus value N; and
comparing, by the count evaluation digital circuit, the reference clock cycle count signal and the local cycle count signal with the predefined register setting to generate a control signal.

11. The method of claim 10, wherein the transmitter oscillator comprises a voltage-controlled oscillator (VCO), a number-controlled oscillator (NCO), or a digitally controlled oscillator (DCO).

12. The method of claim 10, further comprising:
generating, by a multiplexer, a combined reference clock signal based on incoming reference clock signals received from digital channels associated with a first chip comprising the transmitter oscillator or other chips within a transmitter module comprising the first chip and the other chips.

13. The method of claim 12, further comprising:
sampling, by a flip-flop digital circuit, the combined reference clock signal based on the local clock signal for generating the reference clock signal to be transmitted to the mod-M counter.

14. The method of claim 12, further comprising:
providing, by a divider, the local clock signal to the digital channels associated with the first chip comprising the transmitter oscillator or the other chips.

15. The method of claim 10, further comprising:
receiving, by a control logic digital circuit, the reference clock cycle count signal from the mod-M counter;
generating, by the control logic digital circuit, an enable/reset signal based on the reference clock cycle count signal; and
transmitting, by the control logic digital circuit, the enable/reset signal to the mod-N counter.

16. The method of claim 15, wherein the generation of the local clock cycle count signal by the mod-N counter is further based on the enable/reset signal.

17. The method of claim 10, further comprising:
receiving, by a loop filter, the control signal generated by the count evaluation digital circuit; and
transmitting, by the loop filter, the control signal to the transmitter oscillator for adjusting a frequency of the local clock signal to be consistent with the reference clock signal.

18. The method of claim 10, wherein the control signal comprises at least an up signal and a down signal.

* * * * *

UNITED STATES PATENT AND TRADEMARK OFFICE
CERTIFICATE OF CORRECTION

| | |
|---|---|
| PATENT NO. | : 10,879,910 B1 |
| APPLICATION NO. | : 16/560736 |
| DATED | : December 29, 2020 |
| INVENTOR(S) | : Thorkild Franck et al. |

It is certified that error appears in the above-identified patent and that said Letters Patent is hereby corrected as shown below:

On the Title Page

Item (73) Assignee: "Mellanox Technologies Ltd., Yokneam (IL)" should read --Mellanox Technologies Denmark ApS., Roskilde (DK)--

Signed and Sealed this
Thirty-first Day of May, 2022

Katherine Kelly Vidal
*Director of the United States Patent and Trademark Office*